(12) United States Patent
New et al.

(10) Patent No.: US 6,201,410 B1
(45) Date of Patent: Mar. 13, 2001

(54) WIDE LOGIC GATE IMPLEMENTED IN AN FPGA CONFIGURABLE LOGIC ELEMENT

(75) Inventors: Bernard J. New, Los Gatos; Steven P. Young, San Jose; Shekhar Bapat, Santa Clara; Kamal Chaudhary; Trevor J. Bauer, both of San Jose; Roman Iwanczuk, Truckee, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/374,470

(22) Filed: Aug. 13, 1999

Related U.S. Application Data

(60) Continuation-in-part of application No. 09/283,472, filed on Apr. 1, 1999, now Pat. No. 6,051,992, which is a division of application No. 08/835,088, filed on Apr. 4, 1997, now Pat. No. 5,920,202, which is a continuation-in-part of application No. 08/806,997, filed on Feb. 26, 1997, now Pat. No. 5,914,616.

(51) Int. Cl.⁷ .................. H01L 25/00; H03K 19/177; H03K 19/173
(52) U.S. Cl. .................. 326/41; 326/38; 326/47
(58) Field of Search ............... 326/41, 40, 38, 326/47, 37, 105

(56) References Cited

U.S. PATENT DOCUMENTS

| Re. 34,363 | 8/1993 | Freeman . | |
|---|---|---|---|
| 4,124,899 | 11/1978 | Birkner et al. | 364/716 |
| 4,642,487 | 2/1987 | Carter . | |
| 4,706,216 | 11/1987 | Carter . | |
| 4,750,155 | 6/1988 | Hsieh | 365/203 |
| 4,758,745 | 7/1988 | Elgamal et al. . | |
| 4,821,233 | 4/1989 | Hsieh | 365/203 |
| 4,870,302 | 9/1989 | Freeman . | |
| 5,001,368 | 3/1991 | Cliff et al. | 307/465 |
| 5,073,729 | 12/1991 | Greene et al. . | |
| 5,079,451 | 1/1992 | Gudgar et al. | 307/465 |

(List continued on next page.)

FOREIGN PATENT DOCUMENTS

| 0451798A2 | 4/1991 | (EP) . |
|---|---|---|
| 0461798A2 | 6/1991 | (EP) . |
| 0 630 115 A2 | 12/1994 | (EP) . |
| 0748049A2 | 12/1996 | (EP) . |
| 746107A2 | 12/1996 | (EP) . |
| 2 295 738 | 6/1996 | (GB) . |
| 2300951A | 11/1996 | (GB) . |
| WO 93/05577 | 8/1992 | (WO) . |
| WO9410754 | 5/1994 | (WO) . |

OTHER PUBLICATIONS

"The Programmable Logic Data Book", 1996, available from Xilinx Inc., 2100 Logic Drive, San Jose, California, 95124, pp. 4–1 to 4–49.

(List continued on next page.)

Primary Examiner—Michael Tokar
Assistant Examiner—Daniel D. Chang
(74) Attorney, Agent, or Firm—Lois D. Cartier

(57) ABSTRACT

The invention allows the implementation of common wide logic functions using only two function generators of a field programmable gate array. One embodiment of the invention provides a structure for implementing a wide AND-gate in an FPGA configurable logic element (CLE) or portion thereof that includes no more than two function generators. First and second function generators are configured as AND-gates, the output signals (first and second AND signals) being combined in a 2-to-1 multiplexer controlled by the first AND signal, "0" selecting the first AND signal and "1" selecting the second AND signal. Therefore, a wide AND-gate is provided having a number of input signals equal to the total number of input signals for the two function generators. In another embodiment, a wide OR-gate is provided by configuring the function generators as OR-gates and controlling the multiplexer using the second OR signal.

33 Claims, 6 Drawing Sheets

U.S. PATENT DOCUMENTS

| | | | |
|---|---|---|---|
| 5,122,685 | 6/1992 | Chan et al. | 307/465 |
| 5,144,166 | 9/1992 | Camarota et al. . | |
| 5,148,390 | 9/1992 | Hsieh | 365/95 |
| 5,157,618 | 10/1992 | Ravindra et al. | 364/490 |
| 5,185,706 | 2/1993 | Agrawal et al. | 364/489 |
| 5,198,705 | 3/1993 | Galbraith et al. | 307/465 |
| 5,208,491 | 5/1993 | Edeling et al. . | |
| 5,220,213 | 6/1993 | Chan et al. | 326/40 |
| 5,231,588 | 7/1993 | Agrawal et al. | 364/489 |
| 5,241,224 | 8/1993 | Pedersen et al. | 307/465 |
| 5,243,238 | 9/1993 | Kean . | |
| 5,245,227 | 9/1993 | Furtek et al. | 307/465 |
| 5,258,668 | 11/1993 | Cliff | 307/465 |
| 5,260,610 | 11/1993 | Pedersen et al. . | |
| 5,260,611 | 11/1993 | Cliff et al. . | |
| 5,260,881 | 11/1993 | Agrawal et al. . | |
| 5,267,187 | 11/1993 | Hsieh et al. . | |
| 5,280,202 | 1/1994 | Chan | 307/465 |
| 5,313,119 | 5/1994 | Cooke et al. | 307/465.1 |
| 5,317,209 | 5/1994 | Garverick et al. | 307/465 |
| 5,319,255 | 6/1994 | Garverick et al. | 307/272.3 |
| 5,323,069 | 6/1994 | Smith, Jr. | 307/465 |
| 5,333,279 | 7/1994 | Dunning | 395/325 |
| 5,343,406 | 8/1994 | Freeman et al. | 364/490 |
| 5,347,519 | 9/1994 | Cooke et al. | 371/22.2 |
| 5,349,250 | 9/1994 | New . | |
| 5,357,153 | 10/1994 | Chiang et al. . | |
| 5,359,242 | 10/1994 | Veenstra | 307/465 |
| 5,365,125 | 11/1994 | Goetting et al. . | |
| 5,414,377 | 5/1995 | Feidin | 326/41 |
| 5,455,525 | 10/1995 | Ho et al. . | |
| 5,457,410 | 10/1995 | Ting . | |
| 5,469,003 | 11/1995 | Kean . | |
| 5,481,206 | 1/1996 | New et al. | 326/38 |
| 5,500,609 | 3/1996 | Kean | 326/41 |
| 5,504,440 | 4/1996 | Sasaki | 326/39 |
| 5,537,057 | 7/1996 | Leong et al. | 326/41 |
| 5,543,732 | 8/1996 | McClintock et al. | 326/41 |
| 5,546,018 | 8/1996 | New et al. | 326/38 |
| 5,546,596 | 8/1996 | Geist | 395/200.02 |
| 5,581,199 | 12/1996 | Pierce et al. . | |
| 5,583,450 | 12/1996 | Trimberger et al. | 326/41 |
| 5,596,287 * | 1/1997 | Cho | 326/40 |
| 5,629,886 | 5/1997 | New . | |
| 5,635,851 | 6/1997 | Tavana | 326/27 |
| 5,646,546 | 7/1997 | Bertolet et al. | 326/39 |
| 5,682,107 | 10/1997 | Tavana et al. | 326/41 |
| 5,724,276 | 3/1998 | Rose et al. | 364/716.06 |
| 5,740,069 | 4/1998 | Agrawal et al. | 326/47 |
| 5,760,604 | 6/1998 | Pierce et al. | 326/41 |
| 5,889,413 | 3/1999 | Bauer | 326/40 |
| 5,894,426 * | 4/1999 | Ju | 364/175.06 |
| 5,898,319 * | 4/1999 | New | 326/41 |

OTHER PUBLICATIONS

Neil H. E. Weste and Kamran Eshraghian, "Principles of CMOS VLSI: A Systems Approach", by AT&T Bell Laboratories, Inc, published by Addison–Wesley Publishing Company, copyright 1985, pp. 56.

"The Programmable Gate Array Data Book", 1989, available from Xilinx Inc., 2100 Logic Drive, San Jose, California, 95124, pp. 6–30 through 6–44.

"The Programmable Logic Data Book", 1993, available from Xilinx Inc., 2100 Logic Drive, San Jose, California, 95124, pp. 1–1 through 1–7; 2–1 through 2–42; 2–97 through 2–130; and 2–177 through 2–204.

Luis Morales, "Boundary Scan In XC4000 Devices", XAPP 017.001, Oct. 1992, pp. 2–108 and 2–180.

Lucent Technologies, Microelectronics Group, ORCA, "Field–Programmable Gate Arrays Data Book," Oct. 1996, pp. 2–9 to 2–20.

Altera Corporation, "FLEX 10K Embedded Programmable Logic Family Data Sheet" from the Altera Digital Library, 1996, available from Altera Corporation, 2610 Orchard Parkway, San Jose, CA 95134–2020, pp. 31–53.

Xilinx, Inc., "The Programmable Logic Data Book", Sep. 1996, available from Xilinx, Inc., 2100 Logic Drive, San Jose, CA 95124, pp. (4–188 to 4–190); (4–294 to 4–295); and (13–13 to 13–15).

Actel Corporation, "ACT Family Field Programmable Gate Array Data Book," Mar. 1991, pp. 1–1 to 1–51.

* cited by examiner

WIDE LOGIC GATE IMPLEMENTED IN AN FPGA CONFIGURABLE LOGIC ELEMENT

CROSS-REFERENCE TO RELATED APPLICATIONS

This application is a continuation-in-part application of commonly assigned U.S. patent application Ser. No. 09/283,472, invented by Steven P. Young, Shekhar Bapat, Kamal Chaudhary, Trevor J. Bauer, and Roman Iwanczuk entitled "CONFIGURABLE LOGIC ELEMENT WITH ABILITY TO EVALUATE FIVE AND SIX INPUT FUNCTIONS" and filed Apr. 1, 1999, and now issued as U.S. Pat. No. 6,051,992; which is a divisional application of commonly assigned U.S. patent application Ser. No. 08/835,088, invented by Steven P. Young, Shekhar Bapat, Kamal Chaudhary, Trevor J. Bauer, and Roman Iwanczuk entitled "CONFIGURABLE LOGIC ELEMENT WITH ABILITY TO EVALUATE FIVE AND SIX INPUT FUNCTIONS", filed Apr. 4, 1997 and now issued as U.S. Pat. No. 5,920,202; which is a continuation-in-part of U.S. patent application Ser. No. 08/806,997 invented by Steven P. Young, Kamal Chaudhary, and Trevor J. Bauer entitled "FPGA REPEATABLE INTERCONNECT STRUCTURE WITH HIERARCHICAL INTERCONNECT LINES", filed Feb. 26, 1997 and now issued as U.S. Pat. No. 5,914,616, all of which are incorporated herein by reference.

FIELD OF THE INVENTION

The invention relates to programmable integrated circuit devices, more particularly to wide logic gates implemented in a single configurable logic element in a field programmable logic device.

BACKGROUND OF THE INVENTION

Field Programmable Gate Arrays (FPGAs) typically include an array of tiles. Each tile includes a Configurable Logic Element (CLE) connectable to CLEs in other tiles through programmable interconnect lines. The interconnect lines typically provide for connecting each CLE to each other CLE. Interconnect delays on signals using these interconnect lines, even between adjacent CLEs, are typically much larger than delays on signals that remain within a single CLE. Therefore, it is desirable to implement a logic function in a single CLE whenever possible, rather than spreading out the logic into two or more CLEs.

CLEs typically include combinatorial function generators, which are often implemented as 4-input lookup tables. Some CLEs can also implement any 5-input function, and some wider functions, by selecting between the output signals of two 4-input function generators with another CLE input signal. One such CLE, implemented in the Xilinx XC4000™-Series FPGAs, is described in pages 4-11 through 4-23 of the Xilinx September 1996 Data Book entitled "The Programmable Logic Data Book", available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.) A portion of an XC4000-Series CLE that can implement any 5-input function is shown in FIG. 1. The output signals F' and G' of the two function generators F and G can be optionally combined with a third input signal H1 in a third function generator 3H to form output signal 3H'. (In the present specification, the same reference characters are used to refer to terminals, signal lines, and their corresponding signals.) The 3H function generator can implement any function of the three input signals (256 functions), including a 2-to-1 multiplexer that can be used when a 5-input function is desired. When function generators F and G share the same four input signals (F1/G1, F2/G2, F3/G3, F4/G4) and function generator 3H is programmed to function as a 2-to-1 multiplexer, output signal 3H' can represent any function of up to five input signals (F1/G1, F2/G2, F3/G3, F4/G4, H1). When the input signals driving function generators F and G are independent, output signal 3H' can represent some functions of up to nine input signals (F1, F2, F3, F4, G1, G2, G3, G4, H1).

For example, to implement a wide AND-gate in an XC4000-Series FPGA, all the function generators F, G, 3H can be configured as AND-gates, as shown in FIG. 2A. Function generators F, G are configured as two 4-input AND-gates, while function generator 3H is configured as a 3-input AND-gate. The resulting output signal 3H' is the 9-input AND-function of input signals G1–G4, H1, and F1–F4.

Similarly, as shown in FIG. 2B, a 9-input OR-gate can be implemented by configuring all the function generators F, G, 3H as OR-gates. The resulting output signal 3H' is the 9-input OR-function of input signals G1–G4, H1, and F1–F4.

Many other 9-input functions can be implemented in an XC4000-Series CLE. These wide logic functions are made possible only by the 3-input function generator 3H. Without the third function generator, the logic functions that can be implemented in a single CLE are much more limited. However, a 3-input function generator requires a great deal more silicon to implement than a more limited function such as, for example, a 2-to-1 multiplexer. Therefore, many CLEs do not include a third function generator as a supplement to a pair of 4-input function generators.

Function generator 3H can be replaced by a 2-to-1 multiplexer, with signal H1 selecting between output signals F' and G'. Replacing function generator 3H of FIG. 1 with a 2-to-1 multiplexer reduces the number of supported functions with up to nine input signals, but still provides any function of up to five input signals and reduces the silicon area required to implement a 5-input function generator. An FPGA using two 4-input function generators and a 2-to-1 multiplexer to implement a 5-input function generator is the XC3000™ family of products from Xilinx, Inc. The XC3000 CLE is described in pages 4-294 through 4-295 of the Xilinx September 1996 Data Book entitled "The Programmable Logic Data Book", available from Xilinx, Inc., which pages are incorporated herein by reference.

It would be advantageous to be able to implement certain wide logic gates using only two function generators. It is therefore desirable to provide structures and methods for implementing wide logic functions such as wide AND and OR-gates in a CLE while using only two function generators.

SUMMARY OF THE INVENTION

A first aspect of the invention provides a structure and method for implementing a wide AND-gate in an FPGA configurable logic element (CLE) or portion thereof that includes no more than two function generators. First and second function generators are configured as AND-gates. The output signals from the function generators (first and second AND signals) are combined in a 2-to-1 multiplexer controlled by the first AND signal. If all input signals to the first function generator are high, then the first AND signal is high, and the multiplexer passes the second AND signal. If at least one of the input signals to the first function generator is low, then the first AND signal is low, and the multiplexer passes the first AND signal, thereby providing a low multiplexer output signal. Therefore, a wide AND-gate is provided having a number of input signals equal to the total number of input signals for the two function generators.

Another embodiment of the invention provides a structure for generating other wide logic functions incorporating an AND function. For example, an OR-AND structure can be provided by configuring the first and second function generators as OR-gates, then using the 2-to-1 multiplexer (coupled as described above for the wide AND-gate) to AND together the output signals from the function generators.

A second aspect of the invention provides a structure and method for implementing a wide OR-gate in an FPGA CLE or portion thereof that includes no more than two function generators. First and second function generators are configured as OR-gates. The output signals from the function generators (first and second OR signals) are combined in a 2-to-1 multiplexer controlled by the second OR signal. If all input signals to the second function generator are low, then the second OR signal is low, and the multiplexer passes the first OR signal. If at least one of the input signals to the second function generator is high, then the second OR signal is high, and the multiplexer passes the second OR signal, thereby providing a high multiplexer output signal. Therefore, a wide OR-gate is provided having a number of input signals equal to the total number of input signals for the two function generators.

Another embodiment of the invention provides a structure for generating other wide logic functions incorporating an OR function. For example, an AND-OR structure can be provided by configuring the first and second function generators as AND-gates, then using the 2-to-1 multiplexer (coupled as described above for the wide OR-gate) to OR together the output signals from the function generators.

The invention allows the implementation of common wide logic functions in a single CLE. This efficient use of resources is advantageous. For example, two independent 8-input AND-gates can be implemented in a single CLE of a Virtex™ FPGA from Xilinx, Inc.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 1:
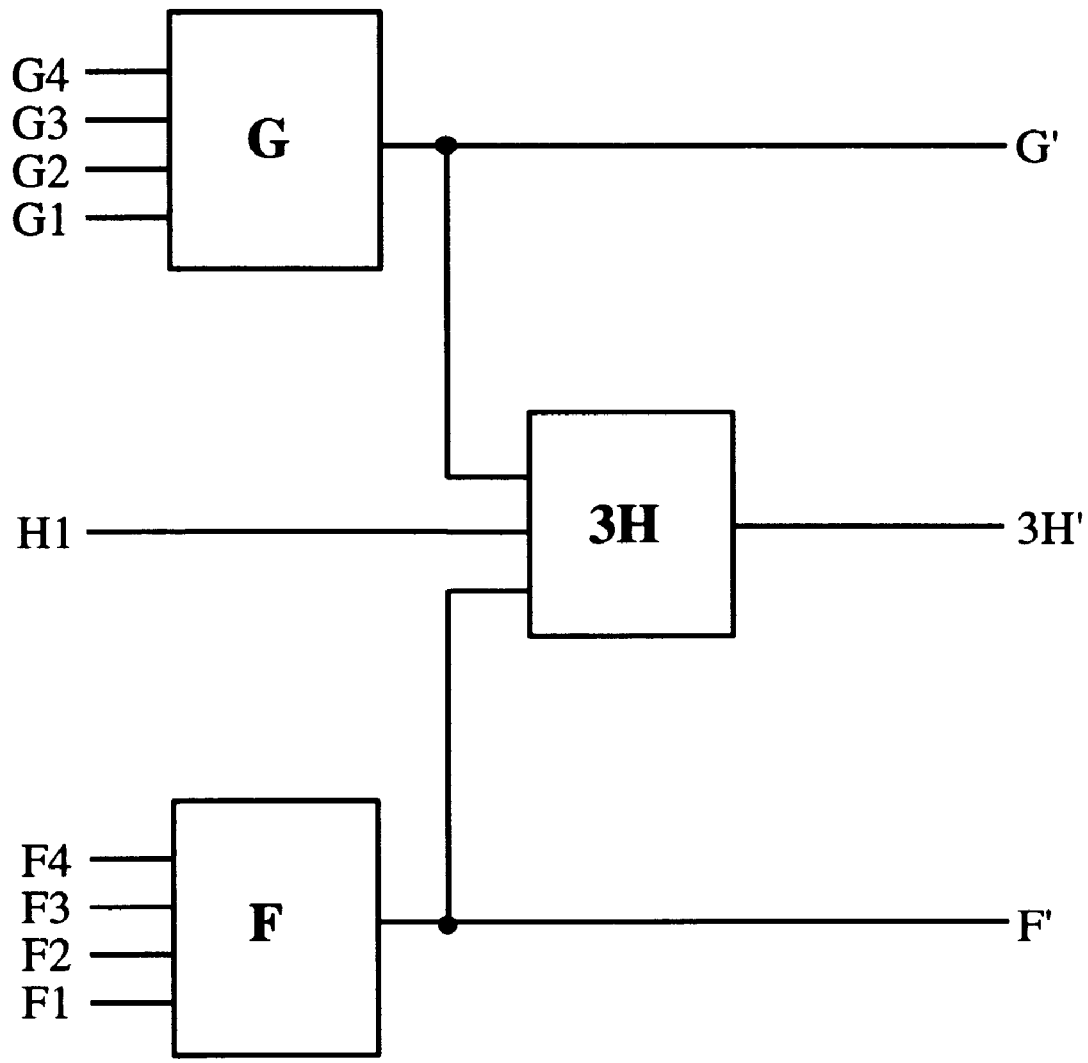
FIG. 1 shows a simplified diagram of a prior art XC4000-Series CLE.
Figure 2A:
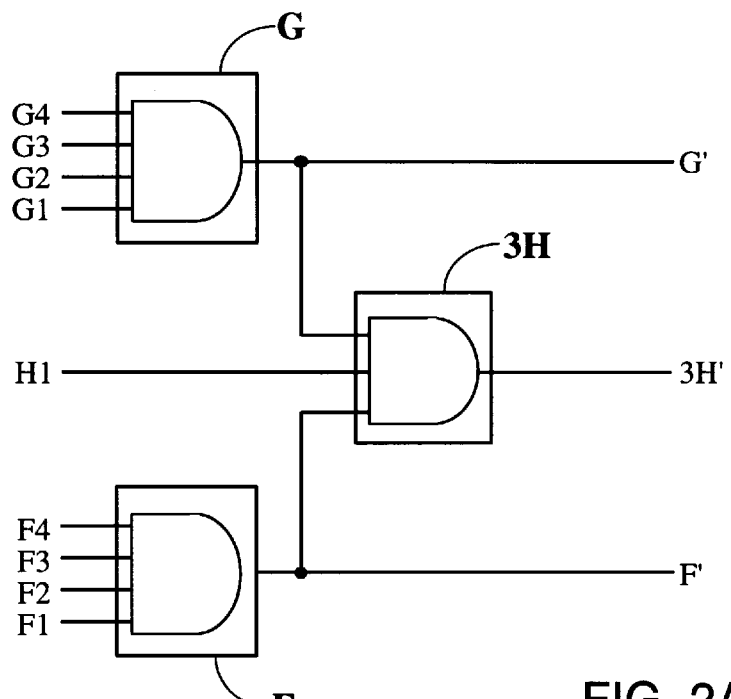
FIG. 2A shows a 9-input AND-gate implemented in an XC4000-Series CLE.
Figure 2B:
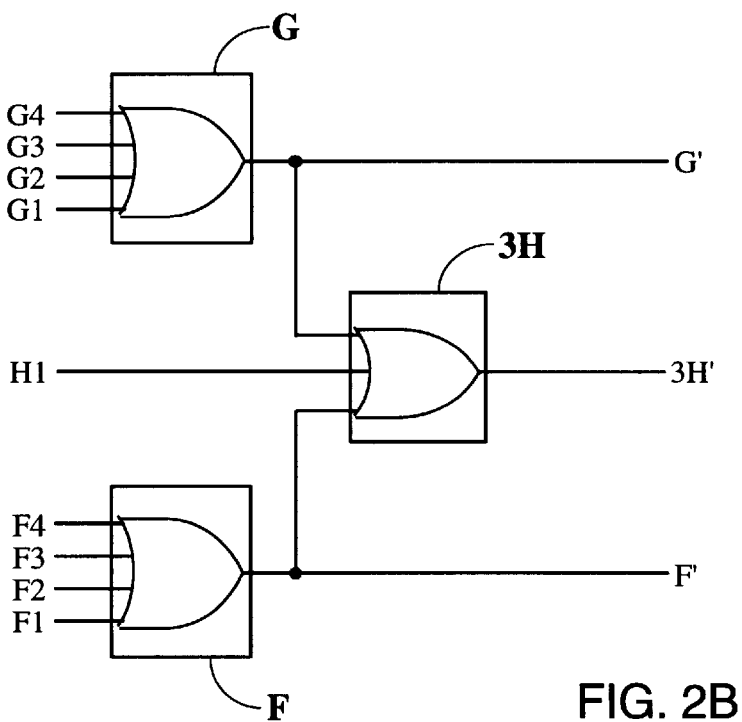
FIG. 2B shows a 9-input OR-gate implemented in an XC4000-Series CLE.
Figure 3:
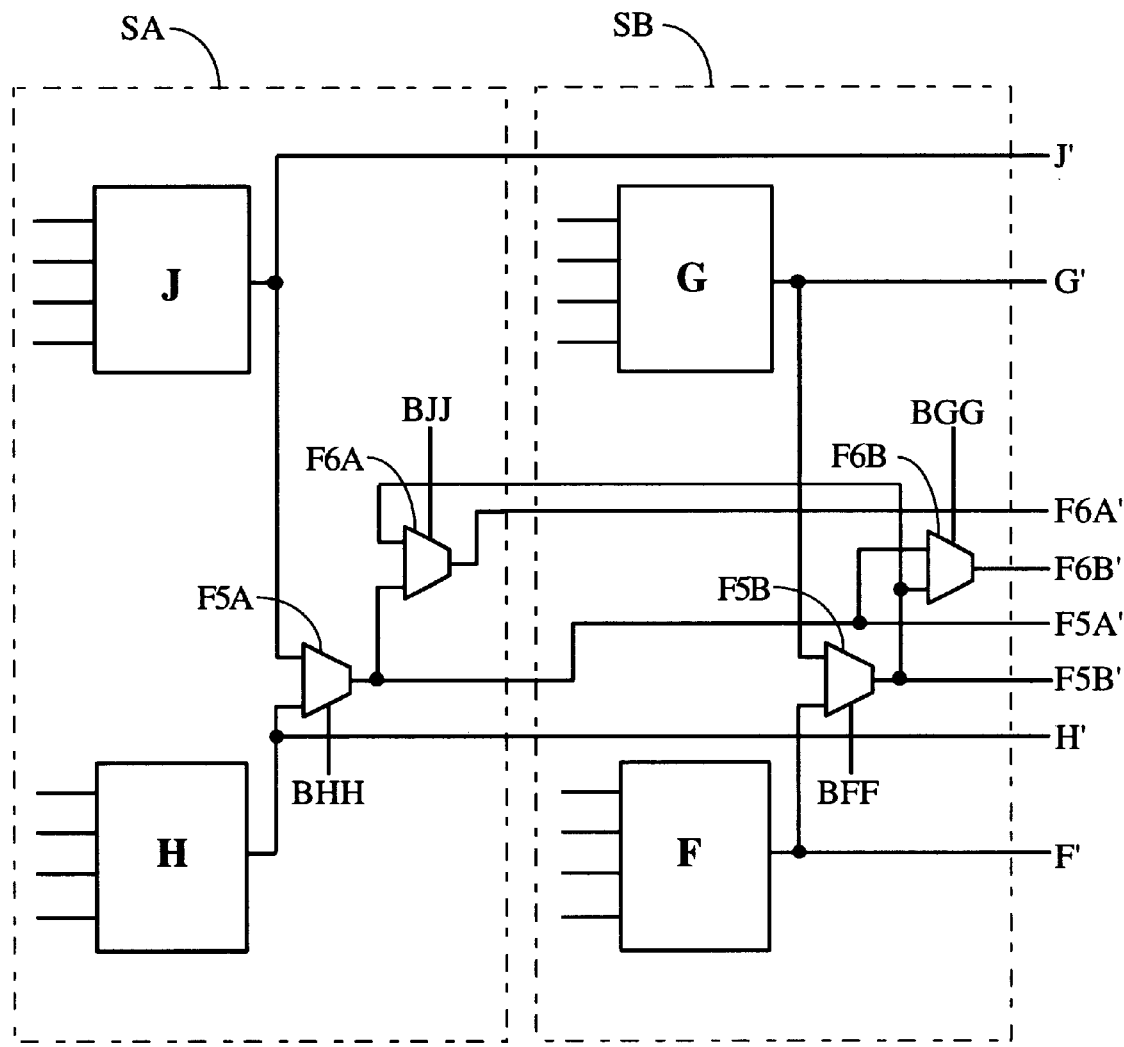
FIG. 3 shows a simplified diagram of a Virtex CLE.

Young et al, in U.S. Pat. Nos. 5,914,616 and 5,920,202 (referenced above), describe a Virtex FPGA wherein a Configurable Logic Element (CLE) is preferably included in each of an array of identical tiles. Young et al's CLE includes four 4-input function generators, as shown in FIG. 3. The output signals from first and second function generators J, H are combined with an independent input signal BHH in a five-input-function multiplexer F5A to produce an output signal F5A' that can be any function of five input signals. Additionally, multiplexer F5A can provide some functions of up to nine input signals, since none of the input signals are shared between the function generators J, H. The output signals from the third and fourth function generators G, F are similarly combined in five-input-function multiplexer F5B to generate an output signal F5B' that can also be any function of five input signals.

The output signals F5A', F5B' of the two five-input-function multiplexers F5A, F5B are then combined with a sixth independent input signal BJJ in a first six-input-function multiplexer F6A, and with a different sixth independent input signal BGG in a second six-input-function multiplexer F6B. The two six-input-function multiplexers F6A, F6B provide two output signals F6A', F6B', respectively. One of the output signals can be any function of six inputs; the other output signal can be a related function of six input signals, where five input signals and two five-input-function multiplexers are shared between the two 6-input functions. When the sixth input signal is also shared, the two 6-input functions are the same, and output signals F6A' and F6B' are the same.

Clearly, either of the six-input-function multiplexers F6A, F6B can be combined with the other elements of the CLE to provide either a 6-input AND-gate or a 6-input OR-gate. However, this obvious implementation uses all four of the function generators F, G, H, J, as well as both five-input-function multiplexers F5A, F5B and one of the six-input-function multiplexers F6A, F6B, while providing only a 6-input wide AND or OR-gate. It is desirable to provide an implementation that uses the CLE resources more efficiently.

The CLE of FIG. 3 can be viewed as two slices SA, SB. Each slice SA, SB comprises two 4-input function generators (H and J, F and G, respectively), one five-input-function multiplexer (F5A, F5B, respectively), and one six-input-function multiplexer (F6A, F6B, respectively). The two slices are symmetric, and in one embodiment are laid out as mirror images of each other. In one embodiment, the invention provides a structure for implementing an 8-input AND-gate in a single slice of a Virtex CLE, using only two 4-input function generators and one five-input-function multiplexer, as described below in connection with FIG. 4. A similar structure for implementing an 8-input OR-gate is also provided, as described in connection with FIG. 5. Because each of these circuits is implemented in only one slice of the CLE, any combination of two independent such functions can be implemented in a single CLE. Thus, the invention provides a 2-to-1 savings of resources over the implementation that uses the six-input-function multiplexer as described above, while accommodating (in this example) two additional input signals.

Figure 4:
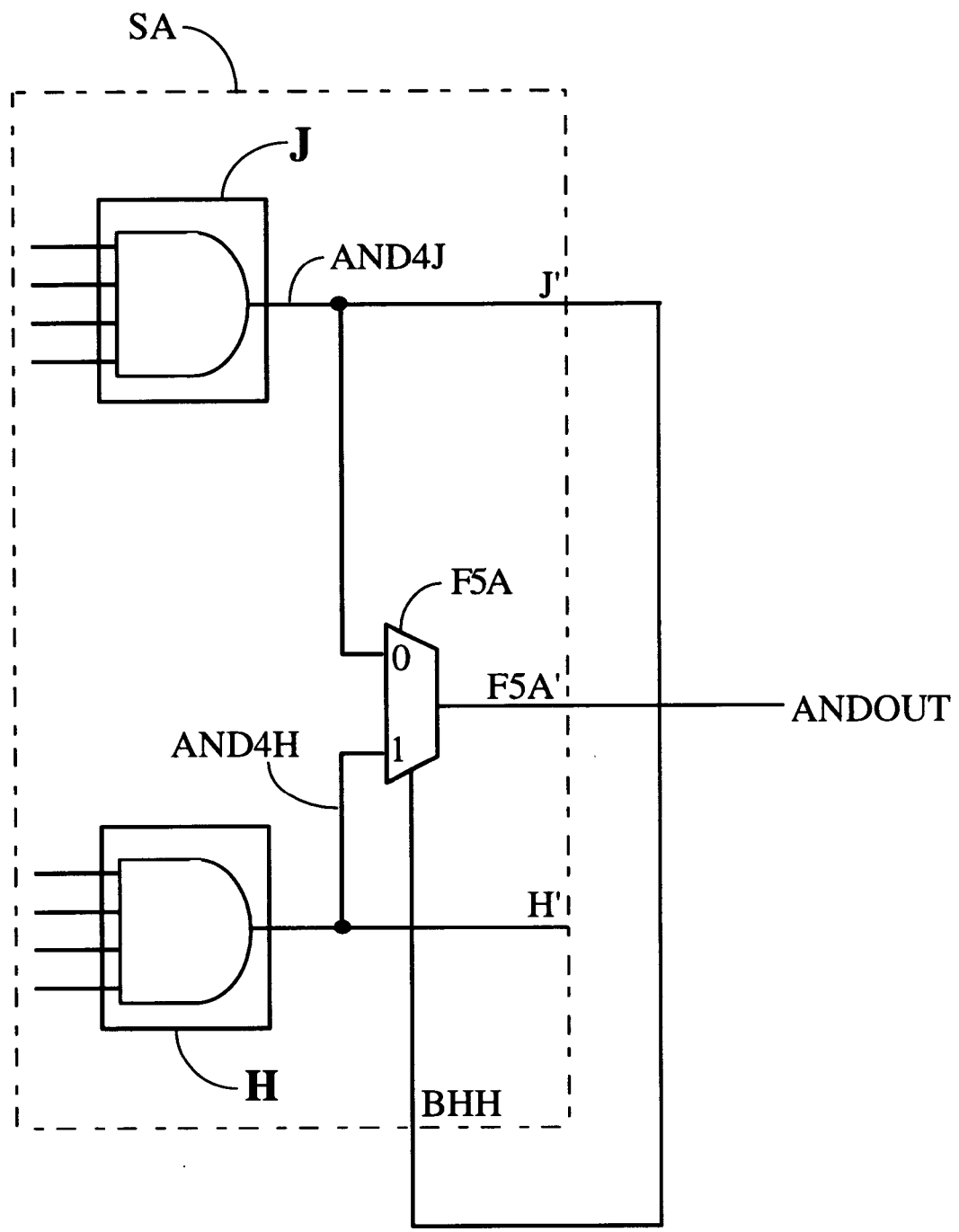
FIG. 4 shows an 8-input AND-gate implemented in one slice of a Virtex CLE.

FIG. 4 shows an 8-input AND-gate implemented in a single slice of a Virtex CLE according to one embodiment of the invention. In this embodiment, first and second function generators J, H are configured as 4-input AND-gates. The output signals from function generators J, H (AND signals AND4J, AND4H, respectively) are combined in a 2-to-1 multiplexer F5A controlled by AND signal AND4J. AND signal AND4J is passed by multiplexer F5A if the select signal (also AND4J) is low; while AND signal AND4H is passed if the select signal is high.

AND signal AND4J is preferably fed back from the CLE output terminal J' to the multiplexer select terminal BHH using the fastest available interconnect path. For example, AND signal AND4J can exit the CLE at terminal "V" in Young et al's FIG. 6A of U.S. Pat. No. 5,914,616, and re-enter the CLE at terminal "BH". In another embodiment, the AND signal AND4J is provided to the multiplexer select terminal BHH via a "fast feedback path", i.e., a high-speed path that bypasses the general interconnect lines, thereby further improving the performance of the wide logic function.

If all four input signals to function generator J are high, then AND signal AND4J is high, and multiplexer F5A passes AND signal AND4H to provide output signal AND-OUT. If at least one of the input signals to function generator J is low, then AND signal AND4J is low, and multiplexer F5A passes AND signal AND4J, thereby providing a low output signal ANDOUT. Therefore, an 8-input AND-gate is provided using only two function generators and only half of the Virtex CLE.

Note that although this embodiment is described in terms of a Virtex CLE, this embodiment can actually be implemented in any CLE having the elements and output terminals used in the embodiment of FIG. 4.

In another embodiment of the invention (not shown) other structures are provided for generating other wide logic functions incorporating an AND function. For example, an OR-AND structure can be provided by configuring function generators H and J as OR-gates, then using multiplexer F5A (coupled as shown in FIG. 4) to AND together the output signals from the function generators.

Figure 5:
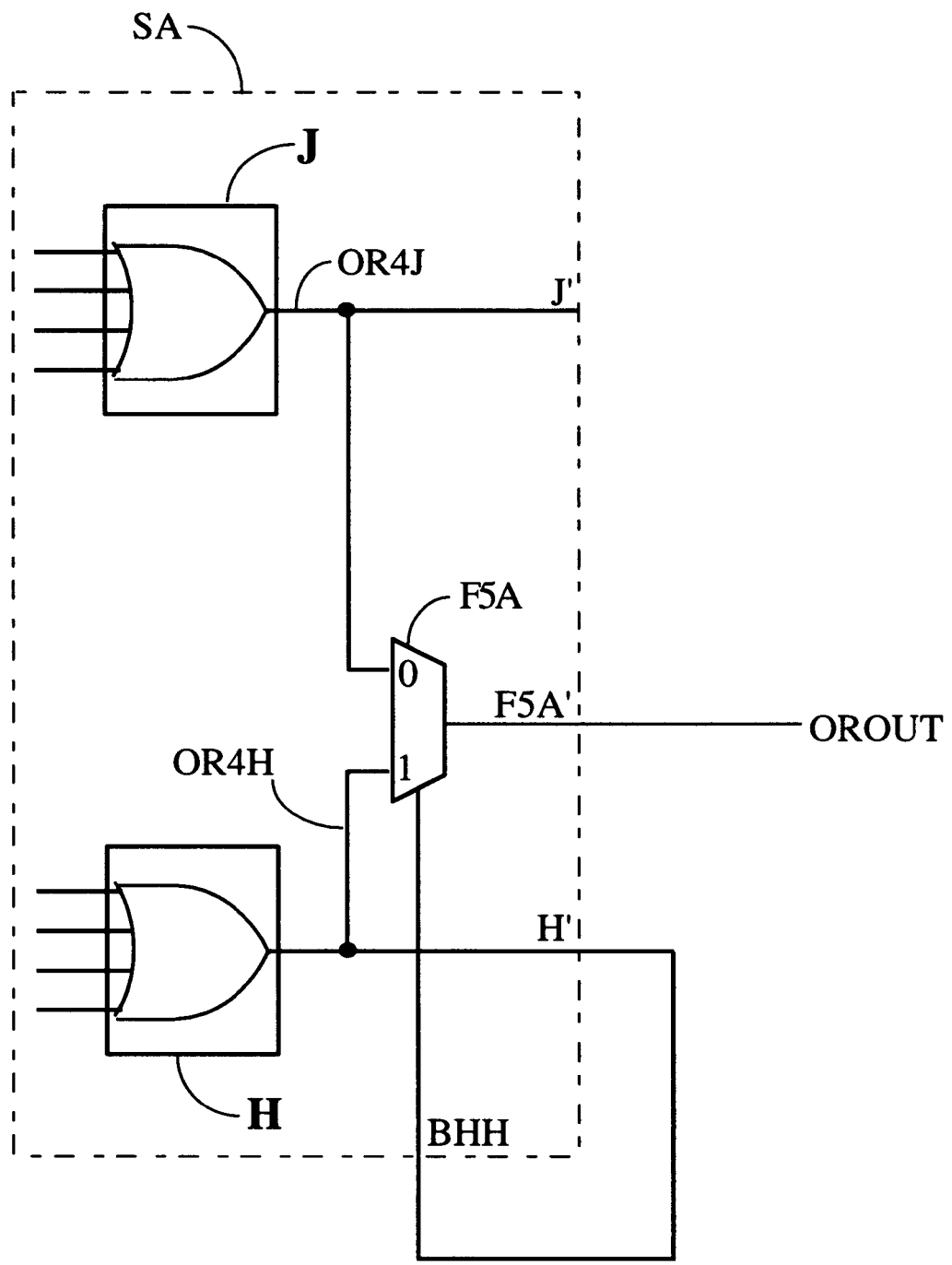
FIG. 5 shows an 8-input OR-gate implemented in one slice of a CLE similar to the Virtex CLE.

FIG. 5 shows an 8-input OR-gate implemented in a single slice of a CLE according to another embodiment of the invention. In this embodiment, first and second function generators J, H are configured as 4-input OR-gates. The output signals from function generators J, H (OR signals OR4J, OR4H, respectively) are combined in 2-to-1 multiplexer F5A controlled by OR signal OR4H. OR signal OR4J is passed by multiplexer F5A if the select signal (OR4H) is low; while OR signal OR4H is passed if the select signal is high.

OR signal OR4H is preferably fed back from the CLE output terminal H' to the multiplexer select terminal BHH using the fastest available interconnect path.

If all four input signals to function generator H are low, then OR signal OR4H is low, and multiplexer F5A passes OR signal OR4J to provide output signal OROUT. If at least one of the input signals to function generator H is high, then OR signal OR4H is high, and multiplexer F5A passes OR signal OR4H, thereby providing a high output signal OROUT. Therefore, an 8-input OR-gate is provided using only two function generators.

Note that the embodiment of FIG. 5 cannot be implemented exactly as shown in a Virtex CLE, because the second function generator and multiplexer output terminals H' and F5A' are shared: both signals exit the CLE on terminal "V" of the CLE, as shown in Young et al's FIG. 6A. However, this embodiment is applicable to a CLE wherein the two output terminals are not shared, and in particular to any CLE having the elements and output terminals used in the embodiment of FIG. 5. Further, a similar 8-input OR-gate can be implemented in a Virtex CLE simply by using the connection scheme shown in FIG. 4 (i.e., by coupling the output signal J' from the first function generator to the multiplexer select terminal), and inverting the sense of the select signal.

In another embodiment of the invention (not shown) other structures are provided for generating other wide logic functions incorporating an OR function. For example, an AND-OR structure can be provided by configuring function generators H and J as AND-gates, then using multiplexer F5A (coupled as shown in FIG. 5) to OR together the output signals from the function generators.

Clearly, in order to implement the invention, both the multiplexer output signal and at least one of the function generator output signals must have access to the interconnect structure (e.g., either a fast feedback path or the general interconnect) at the same time. Note that if the sense of the multiplexer select signal is programmable (i.e., programmably either a high or low select signal passes the output signal from the first function generator to the multiplexer output terminal) then either an AND or an OR-function can be implemented, even if only one of the function generator output signals has access to the interconnect structure at the same time as the multiplexer output signal.

Figure 6:
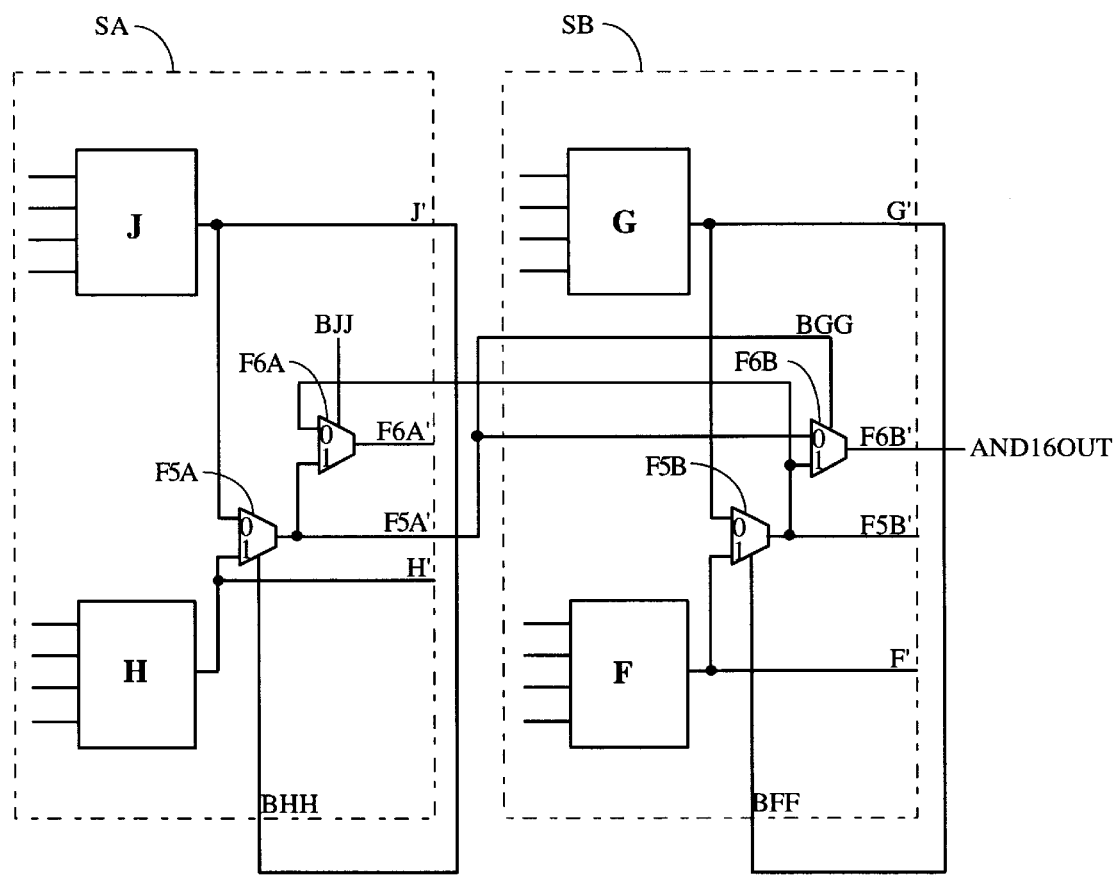
FIG. 6 shows a 16-input AND-gate implemented in two slices of a CLE similar to the Virtex CLE.

In another embodiment of the invention, each slice of a CLE is used to implement a wide function as previously described (e.g., each slice is used to implement an 8-input AND gate). The two 8-input signals are then combined in an additional 2-to-1 multiplexer to generate an even wider logic function (e.g., a 16-input AND gate). The additional multiplexer is controlled by a select signal provided by either of the two slices (e.g., by either of the two 8-input AND signals). According to this embodiment, a 16-input AND-gate is implemented as shown in FIG. 6. Note that in order to implement this embodiment one function generator output signal from each slice, plus three 2-to-1 multiplexer output signals, must have access to the interconnect structure at the same time.

In another embodiment, the F6A multiplexer is controlled as previously described to combine the signals generated by multiplexers F5A and F5B, where multiplexers F5A and F5B are conventionally used as simple multiplexers.

Using de Morgan's law, an OR-gate can be interpreted as a NAND-gate with inverted input signals, and an AND-gate can be interpreted as a NOR-gate with inverted input signals. Therefore, by using the function generators to provide inversion to the NAND or NOR function input signals, NAND and NOR-gates can also be implemented using the 2-to-1 multiplexer similar to the OR and AND-gates described above.

In one embodiment, not all of the function generator input terminals are used; for example, an AND-gate or OR-gate with less than eight input signals is generated from two 4-input function generators. In another embodiment, the two function generators have fewer or more than four input signals. In yet another embodiment, the two function generators have or are configured to have different numbers of input signals.

Those having skill in the relevant arts of the invention will now perceive various modifications and additions which may be made as a result of the disclosure herein of the preferred embodiment. For example, the above text describes the structures and methods of the invention in the context of the Virtex CLE from Xilinx, Inc. However, the invention can also be applied to other FPGAs and other programmable logic devices. Further, CLEs, function generators, and multiplexers other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A structure for implementing a wide logic function in an FPGA configurable logic element (CLE), comprising:
   a first function generator having at least n input signals and an output terminal, the first function generator being configured as an n-input logic function;
   a second function generator having at least m input signals and an output terminal, the second function generator being configured as an m-input logic function, the m input signals being independent from the n input signals; and
   a multiplexer having a first input terminal coupled to the output terminal of the first function generator, a second input terminal coupled to the output terminal of the second function generator, and a select terminal coupled to the output terminal of at least one of the first and second function generators, wherein:
      the multiplexer passes a signal at the first input terminal when a select signal provided at the select terminal is low, and
      the multiplexer passes a signal at the second input terminal when the select signal is high.

2. The CLE of claim 1, wherein:
   the select terminal is coupled to the output terminal of the first function generator; and
   the CLE is configured to implement a wide logic function comprising an AND-gate having (n+m) input signals.

3. The CLE of claim 1, wherein:
   the select terminal is programmably coupled to the output terminal of the second function generator; and
   the CLE is configured to implement a wide logic function comprising an OR-gate having (n+m) input signals.

4. The structure of claim 1, wherein n equals m.

5. The structure of claim 1, wherein n is not equal to m.

6. The structure of claim 1, wherein the first function generator has x input terminals, and n equals x.

7. The structure of claim 1, wherein the first function generator has x input terminals, and n is less than x.

8. The structure of claim 1, wherein the second function generator has y input terminals, and m equals y.

9. The structure of claim 1, wherein the first function generator has y input terminals, and m is less than y.

10. The structure of claim 1, wherein:
    the FPGA comprises an array of CLEs interconnected with a general interconnect structure;
    the CLE comprises one or more fast feedback paths bypassing the general interconnect structure; and
    the select terminal is coupled to the output terminal of at least one of the first and second function generators by way of at least one such fast feedback path.

11. The structure of claim 1, wherein the sense of the select signal is programmable.

12. A method of implementing a wide logic function in an FPGA configurable logic element (CLE), the CLE comprising first and second function generators and a multiplexer, the multiplexer being coupled to provide an output signal from the first function generator when a select signal is low and to provide an output signal from the second function generator when the select signal is high, the method comprising:
    configuring the first function generator as an n-input logic function;
    configuring the second function generator as an m-input logic function, the m input signals being independent from the n input signals; and
    configurably providing the output signal from at least one of the first and second function generators as the select signal.

13. The method of claim 12, wherein:
    the output signal from the first function generator is provided as the select signal; and
    the CLE is configured to implement a wide logic function comprising an AND-gate having (n+m) input signals.

14. The method of claim 12, wherein:
    the output signal from the second function generator is provided as the select signal; and
    the CLE is configured to implement a wide logic function comprising an OR-gate having (n+m) input signals.

15. The method of claim 12, wherein n equals m.

16. The method of claim 12, wherein n is not equal to m.

17. The method of claim 12, wherein the first function generator has x input terminals, and n equals x.

18. The method of claim 12, wherein the first function generator has x input terminals, and n is less than x.

19. The method of claim 12, wherein the second function generator has y input terminals, and m equals y.

20. The method of claim 12, wherein the first function generator has y input terminals, and m is less than y.

21. The method of claim 12, wherein:
    the FPGA comprises an array of CLEs interconnected with a general interconnect structure;
    the CLE comprises one or more fast feedback paths bypassing the general interconnect structure; and
    the step of configurably providing the output signal from at least one of the first and second function generators as the select signal uses at least one such fast feedback path.

22. The method of claim 12, wherein the sense of the select signal is programmable.

23. A configurable logic element (CLE) in an FPGA, comprising:
    a first function generator having n input signals and an output terminal;
    a second function generator having m input signals and an output terminal, the m input signals being independent from the n input signals; and
    a multiplexer having a first input terminal coupled to the output terminal of the first function generator, a second input terminal coupled to the output terminal of the second function generator, and a select terminal, wherein the multiplexer passes a signal at the first input terminal when a select signal provided at the select terminal is low, and passes a signal at the second input terminal when the select signal is high; and
    means for programmably coupling the select terminal to the output terminal of at least one of the first and second function generators.

24. The CLE of claim 23, wherein:

the select terminal is programmable coupled to the output terminal of the first function generator; and the CLE is configured to implement a wide logic function comprising an AND-gate having (n+m) input signals.

25. The CLE of claim 23, wherein:

the select terminal is programmably coupled to the output terminal of the second function generator; and the CLE is configured to implement a wide logic function comprising an OR-gate having (n+m) input signals.

26. The CLE of claim 23, wherein n equals m.

27. The CLE of claim 23, wherein n is not equal to m.

28. The CLE of claim 23, wherein the first function generator has x input terminals, and n equals x.

29. The CLE of claim 23, wherein the first function generator has x input terminals, and n is less than x.

30. The CLE of claim 23, wherein the second function generator has y input terminals, and m equals y.

31. The CLE of claim 23, wherein the first function generator has y input terminals, and m is less than y.

32. The CLE of claim 23, wherein:

the FPGA comprises an array of CLEs interconnected with a general interconnect structure;

the CLE comprises one or more fast feedback paths bypassing the general interconnect structure; and the select terminal is programmably coupled to at least one of the first and second function generators by way of at least one such fast feedback path.

33. The CLE of claim 23, wherein the sense of the select signal is programmable.

* * * * *